(12) United States Patent
Wang et al.

(10) Patent No.: US 12,557,542 B2
(45) Date of Patent: Feb. 17, 2026

(54) STRETCHABLE DISPLAY PANEL AND MANUFACTURING METHOD THEREFOR, AND DISPLAY DEVICE

(71) Applicant: BOE Technology Group Co., Ltd., Beijing (CN)

(72) Inventors: Bingwei Wang, Beijing (CN); Pinfan Wang, Beijing (CN); Yucheng Chan, Beijing (CN); Zunqing Song, Beijing (CN); Jia Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 359 days.

(21) Appl. No.: 18/025,727

(22) PCT Filed: Mar. 2, 2022

(86) PCT No.: PCT/CN2022/078828
§ 371 (c)(1),
(2) Date: Mar. 10, 2023

(87) PCT Pub. No.: WO2023/164836
PCT Pub. Date: Sep. 7, 2023

(65) Prior Publication Data
US 2024/0292729 A1  Aug. 29, 2024

(51) Int. Cl.
*H10K 77/10* (2023.01)
*H10K 59/131* (2023.01)

(52) U.S. Cl.
CPC ......... *H10K 77/111* (2023.02); *H10K 59/131* (2023.02)

(58) Field of Classification Search
CPC ............... H10K 77/111; H10K 59/131; H10K 2102/311; H10K 59/00; G09F 9/30
See application file for complete search history.

(56) References Cited

U.S. PATENT DOCUMENTS

| | | | |
|---|---|---|---|
| 10,608,071 B2* | 3/2020 | Hong | H10D 86/441 |
| 11,101,296 B2* | 8/2021 | Zhao | H10D 86/441 |
| 12,041,718 B2* | 7/2024 | Wang | H05K 1/0283 |
| 12,310,225 B2* | 5/2025 | Zhu | H10K 59/1201 |
| 2019/0131368 A1 | 5/2019 | Zhang et al. | |
| 2019/0296097 A1* | 9/2019 | Hong | H10K 50/81 |

(Continued)

FOREIGN PATENT DOCUMENTS

| | | |
|---|---|---|
| CN | 107658333 A | 2/2018 |
| CN | 108389884 A | 8/2018 |

(Continued)

*Primary Examiner* — J.E. Schoenholtz
(74) *Attorney, Agent, or Firm* — IPro, PLLC

(57) ABSTRACT

Provided is a stretchable display panel. The stretchable display panel includes: a flexible substrate; a plurality of pixel islands on the flexible substrate, the pixel islands being provided with at least one light-emitting device; and inter-island connectors for connecting the adjacent pixel islands, wherein the inter-island connector includes: an inorganic insulating layer and a first organic insulating layer, wherein the inorganic insulating layer is more proximal to the flexible substrate than the first organic insulating layer, and a plurality of first openings are formed in the inorganic insulating layer, a portion of the first organic insulating layer being in the first openings.

17 Claims, 5 Drawing Sheets

(56) References Cited

U.S. PATENT DOCUMENTS

| | | | |
|---|---|---|---|
| 2021/0134197 A1 | 5/2021 | Ju | |
| 2021/0183988 A1* | 6/2021 | Park | H10K 59/1213 |
| 2023/0056754 A1 | 2/2023 | Zeng et al. | |
| 2024/0427463 A1* | 12/2024 | Bok | G06F 3/0448 |
| 2025/0098459 A1* | 3/2025 | Bang | H10K 59/131 |

FOREIGN PATENT DOCUMENTS

| | | |
|---|---|---|
| CN | 112186023 A | 1/2021 |
| CN | 112750874 A | 5/2021 |
| CN | 113451538 A | 9/2021 |
| CN | 113724590 A | 11/2021 |

* cited by examiner

A-A'

B-B'

STRETCHABLE DISPLAY PANEL AND MANUFACTURING METHOD THEREFOR, AND DISPLAY DEVICE

CROSS-REFERENCE TO RELATED APPLICATION

The present disclosure is a U.S. national stage of international application No. PCT/CN2022/078828, filed on Mar. 2, 2022, the content of which is herein incorporated by reference in its entirety.

TECHNICAL FIELD

The present disclosure relates to the field of display technologies, and in particular, relates to a stretchable display panel and a display device.

BACKGROUND

At present, a great deal of interest has been directed at stretchable display panels, and in particular, stretchable display panels achieve stretching deformation, which brings a brand new use experience for users.

SUMMARY

The embodiments of the present disclosure provide a stretchable display panel and a display device. The technical solutions are as follows:

According to one aspect of some embodiments of the present disclosure, a stretchable display panel is provided. The stretchable display panel includes:
 a flexible substrate;
 a plurality of pixel islands on the flexible substrate, the pixel islands being provided with at least one light-emitting device;
 and inter-island connectors for connecting the adjacent pixel islands, wherein the inter-island connector includes: an inorganic insulating layer and a first organic insulating layer, wherein the inorganic insulating layer is more proximal to the flexible substrate than the first organic insulating layer, and a plurality of openings are formed in the inorganic insulating layer, a portion of the first organic insulating layer being in the first openings.

In some embodiments, one portion of the first openings in the plurality of first openings are through vias, and another portion of the first openings are blind vias;
 the stretchable display panel further includes: a first conductive layer on a side, distal from the first organic insulating layer, of the inorganic insulating layer, wherein an orthographic projection of the first conductive layer on the flexible substrate is overlapped with an orthographic projection of the blind via on the flexible substrate and is not coincident with an orthographic projection of the through via on the flexible substrate.

In some embodiments, the inorganic insulating layer includes: a first inorganic layer and a second inorganic layer that are stacked, wherein the first inorganic layer is more proximal to the flexible substrate than the second inorganic layer, a first via is formed in the first inorganic layer, and a second via and a third via are formed in the second inorganic layer, the first via being in communication with the second via; wherein the through vias are the first via and the second via in communication with each other, and the blind via is the third via.

In some embodiments, the stretchable display panel further includes: a second conductive layer between the first inorganic layer and the second inorganic layer, and a third conductive layer between the second inorganic layer and the first organic insulating layer;
 wherein a plurality of openings are formed in at least one of the first conductive layer, the second conductive layer and the third conductive layer.

In some embodiments, thicknesses of the first conductive layer, the second conductive layer, and the third conductive layer range from 0.5 μm to 5 μm.

In some embodiments, each of the first conductive layer, the second conductive layer, and the third conductive layer includes: a signal wire for being electrically connected to the light-emitting device.

In some embodiments, the stretchable display panel further includes: a packaging layer for covering the pixel islands and the inter-island connectors, and a first elastic layer between the packaging layer and the first organic insulating layer, wherein an elasticity modulus of the first elastic layer is less than an elasticity modulus of the first organic insulating layer.

In some embodiments, the stretchable display panel further includes: a second elastic layer on a side, distal from the flexible substrate, of the packaging layer, wherein an elasticity modulus of the second elastic layer is equal to the elasticity modulus of the first elastic layer.

In some embodiments, the pixel islands and the inter-island connectors define a hollowed-out structure, and the stretchable display panel further includes: an auxiliary signal line, wherein an orthographic projection of the auxiliary signal line on the flexible substrate is at least partially overlapped with an orthographic projection of the hollowed-out structure on the flexible substrate, and the auxiliary signal line is electrically connected to the light-emitting device.

In some embodiments, the stretchable display panel further includes: a second organic insulating layer in the hollowed-out structure, wherein the second organic insulating layer is disposed on a side, distal from the flexible substrate, of the auxiliary signal line.

In some embodiments, the stretchable display panel further includes: a third organic insulating layer in the hollowed-out structure, wherein the third organic insulating layer is disposed on a side, proximal to the flexible substrate, of the auxiliary signal line.

In some embodiments, a third opening is formed in a side, distal from the pixel island, of the flexible substrate, and a region where the third opening is formed is within the orthographic projection of the hollowed-out structure on the flexible substrate.

According to another aspect of some embodiments of the present disclosure, a stretchable display panel is provided. The stretchable display panel includes:
 a flexible substrate;
 a plurality of pixel islands on the flexible substrate, the pixel islands being provided with at least one light-emitting device;
 inter-island connectors for connecting the adjacent pixel islands, wherein the pixel islands and the inter-island connectors define a hollowed-out structure; and
 an auxiliary signal line, wherein an orthographic projection of the auxiliary signal line on the flexible substrate is at least partially coincident with an orthographic projection of the hollowed-out structure on the flexible substrate, and the auxiliary signal line is electrically connected to the light-emitting device.

In some embodiments, the inter-island connector includes: an inorganic insulating layer and a first organic insulating layer, wherein the inorganic insulating layer is more proximal to the flexible substrate than the first organic insulating layer, and a plurality of first openings are formed in the inorganic insulating layer, a portion of the first organic insulating layer being in the first openings.

According to still another aspect of some embodiments of the present disclosure, a display device is provided. The display device includes: a power supply assembly, and a stretchable display panel electrically connected to the power supply assembly, wherein the stretchable display panel is the stretchable display panel described above.

BRIEF DESCRIPTION OF THE DRAWINGS

For clearer descriptions of the technical solutions according to the embodiments of the present disclosure, the accompanying drawings required for describing the embodiments are briefly described hereinafter. Apparently, the accompanying drawings in the following description show merely some embodiments of the present disclosure, and those of ordinary skill in the art may still derive other drawings from these accompanying drawings without any creative efforts.

DETAILED DESCRIPTION

A stretchable display panel generally includes a plurality of pixel islands and inter-island connectors for connecting the adjacent pixel islands. Each of the pixel islands includes a plurality of light-emitting devices. The pixel islands and the inter-island connectors are capable of defining a hollowed-out structure, and the stretchable display panel is stretchable by virtue of the hollowed-out structure. In a case that the stretchable display panel is stretched, the inter-island connector in the stretchable display panel deforms.

However, during a deformation process of the inter-island connector in the current stretchable display panel, film layers in the inter-island connector are easily broken or separated, such that the yield of the stretchable display panel is relatively low.

For clearer descriptions of the objects, technical solutions, and advantages of the present disclosure, the embodiments of the present disclosure are further described in detail below with reference to the accompanying drawings.

Figure 1:
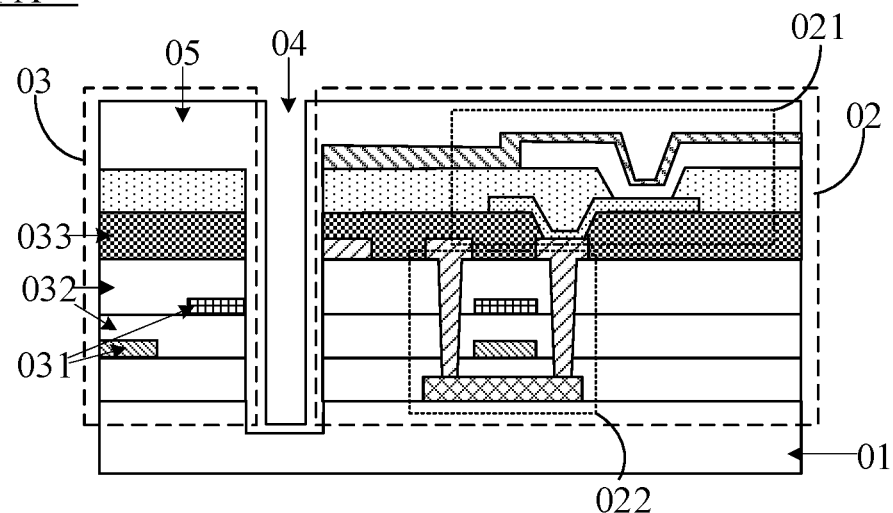
FIG. 1 is a schematic structural diagram of a film layer of a stretchable display panel according to some practices.

In some practices, referring to FIG. 1, FIG. 1 is a schematic structural diagram of a film layer of a stretchable display panel according to the practices. The stretchable display panel 000 includes: a flexible substrate 01, a plurality of pixel islands 02 on the flexible substrate 01, and inter-island connectors 03 for connecting the adjacent pixel islands 02, wherein the pixel islands 02 and the inter-island connectors 03 are capable of defining a hollowed-out structure 000a, and the stretchable display panel 000 is stretchable by virtue of the hollowed-out structure 000a.

The pixel island 02 includes: at least one light-emitting device 021 and a pixel driver circuit 022 electrically connected to the light-emitting device 021. The pixel driver circuit 022 is capable of applying an electrical signal to the light-emitting device 021 to cause the light-emitting device 021 to emit light, thereby enabling the stretchable display panel 000 to display an image.

The inter-island connector 03 includes: a plurality of conductive layers 031, a plurality of inorganic insulating layers 032, and an organic insulating layer 033. FIG. 1 takes a case where an inter-island connector 03 includes two conductive layers 031 and two inorganic insulating layers 032, wherein both of the conductive layer 031 and the inorganic insulating layer 032 are more proximal to the flexible substrate 01 than the organic insulating layer 033. Each of the conductive layers 031 includes signal lines electrically connected to the pixel driver circuit 022. In this way, the pixel driver circuits 022 in different pixel islands 02 are connected in series by the signal lines distributed in the inter-island connectors 03.

However, the inorganic insulating layer 032 in the inter-island connector 03 has a poor stretching deformation capacity. In this way, during a stretching process of the stretchable display panel 000, the inorganic insulating layer 032 does not deform easily along with the inter-island connector 03, such that the inter-island connector 03 has a poor stretching deformation capacity. To allow the stretchable display panel 000 to be stretched normally, it is necessary to increase the stretchable force to the stretchable display panel 000. Thus, the inorganic insulating layer 032 in the inter-island connector 03 is easily broken, and the film layers in the inorganic insulating layer 032 and the organic insulating layer 033 in the inter-island connector 03 are easily separated, such that the yield of the stretchable display panel 000 is relatively low.

In addition, the conductive layer 031 and the inorganic insulating layer 032 in the inter-island connector 03 are corrected with poor tightness. In this way, during the stretching process of the stretchable display panel 000, the film layers in the conductive layer 031 and the inorganic insulating layer 032 in the inter-island connector 03 are easily separated. Moreover, the conductive layer 031 in the inter-island connector 03 has a small thickness, such that the conductive layer 031 in the inter-island connector 03 has relatively poor stretchable failure resistance, that is, the conductive layer 031 is easily broken during the stretching deformation process, thereby further reducing the yield of the stretchable display panel 00. For example, in some practices, the thickness of the conductive layer 031 in the stretchable display panel 000 is 0.3 μm, which has a relatively poor stretchable failure resistance and is easily broken during the stretching deformation process.

Figure 2:
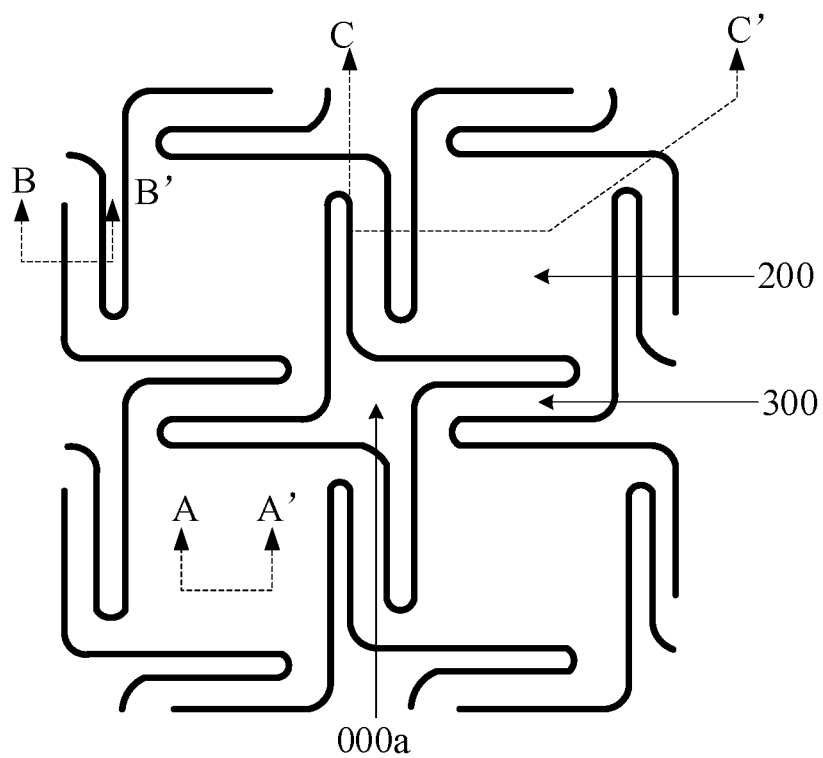
FIG. 2 is a top view of a stretchable display panel according to some embodiments of the present disclosure.

Referring to FIG. 2, FIG. 2 is a top view of a stretchable display panel according to some embodiments of the present disclosure. The stretchable display panel 000 includes: a flexible substrate 100 (not labeled in FIG. 2, and labeled in FIG. 3 subsequently), a plurality of pixel islands 200 on the flexible substrate 100, and inter-island connectors 300 for connecting the adjacent pixel islands 200.

Figure 3:
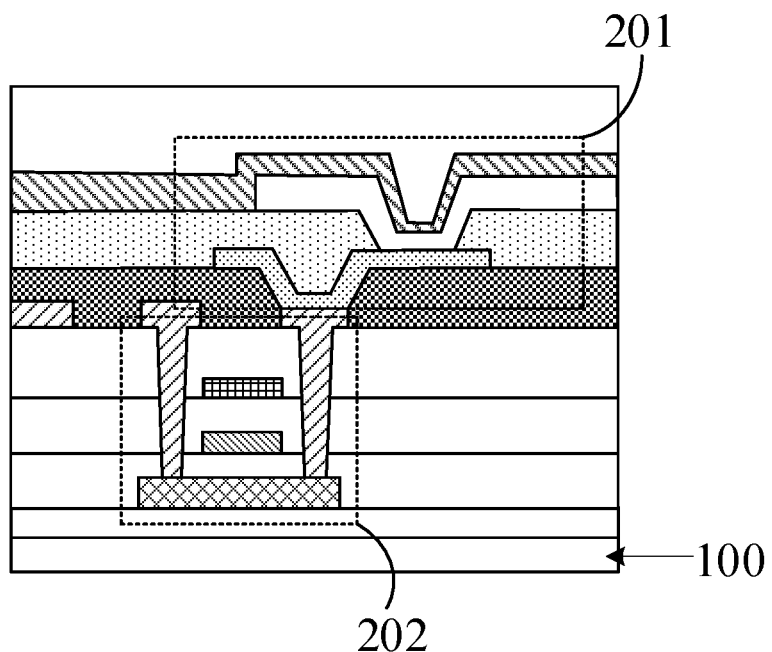
FIG. 3 is a schematic structural diagram of a film layer of the stretchable display panel at A-A' as illustrated in FIG. 2.

For clear illustration of the structure of the pixel islands 200 of the stretchable display panel 000 more clearly, referring to FIG. 3, FIG. 3 is a schematic structural diagram of a film layer of the stretchable display panel at A-A' as illustrated in FIG. 2. Each of the pixel islands 200 is provided with at least one light-emitting device 201. In the present disclosure, each of the pixel islands 200 is further provided with at least one pixel driver circuit 202 in one-to-one correspondence with at least one light-emitting device 201. Each pixel driver circuit 202 is configured to drive the corresponding light-emitting device 201 to emit light, such that the stretchable display panel 000 is capable of displaying an image.

Figure 4:
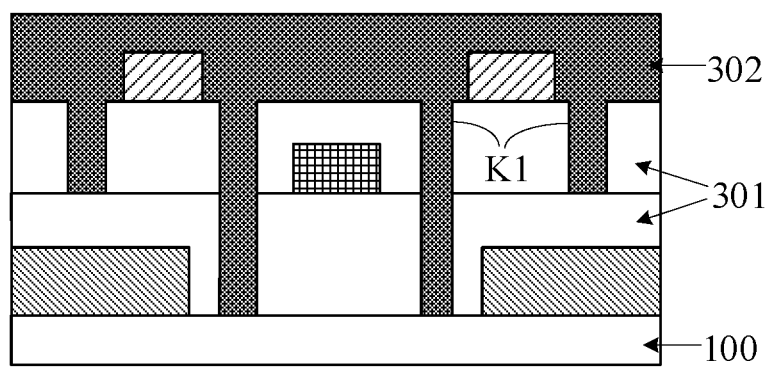
FIG. 4 is a schematic structural diagram of a film layer of the stretchable display panel at B-B' as illustrated in FIG. 2.

For clear illustration of the structure of the inter-island connector 300 of the stretchable display panel 000, referring to FIG. 4, FIG. 4 is a schematic structural diagram of a film layer of the stretchable display panel at B-B' as illustrated in FIG. 2. The inter-island connector 300 includes: the inorganic insulating layer 301 and a first organic insulating layer 302.

Figure 5:
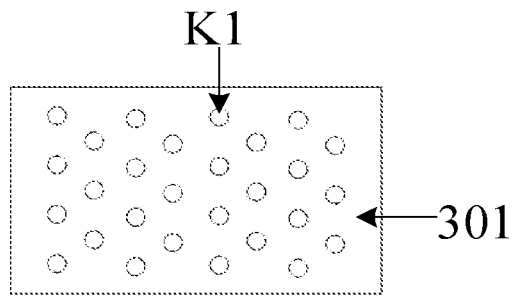
FIG. 5 is a top view of an inorganic insulating layer according to some embodiments of the present disclosure.

The inorganic insulating layer 301 is more proximal to the flexible substrate 100 than the first organic insulating layer 302. Referring to FIG. 4 and FIG. 5, FIG. 5 is a top view of the inorganic insulating layer according to some embodiments of the present disclosure, wherein a plurality of first openings K1 are formed in the inorganic insulating layer 301, and a portion of the first organic insulating layer 302 is disposed in the first openings K1. Herein, the inorganic insulating layer 301 is arranged in the same layer as the inorganic insulating layer on a side, proximal to the flexible substrate 100, of the light-emitting device 201 in the stretchable display panel 000, and the first organic insulating layer 302 is arranged in the same layer as the organic insulating layer on a side, proximal to the flexible substrate 100, of the light-emitting device 201 in the stretchable display panel 000.

In the embodiments of the present disclosure, a size of the inorganic insulating layer 301 is reduced by virtue of a plurality of first openings K1 in the inorganic insulating layer 301, such that an area of an orthographic projection of the inorganic insulating layer 301 on the flexible substrate 100 is relatively small. A portion of the first organic insulating layer 302 is filled in the first openings K1 of the inorganic insulating layer 301, thereby not only improving the stretching deformation capacity of the inter-island connector 300, but also enhancing the adhesion between the inorganic insulating layer 301 and the first organic insulating layer 302. In this way, during the stretching process of the stretchable display panel 000, the degree of interference in the stretching deformation of the inter-island connector 300 from the inorganic insulating layer 301 is reduced, such that the stretchable display panel 000 is normally stretched without a large stretchable force. Thus, by virtue of the plurality of first openings K1 in the inorganic insulating layer 301, during the stretching process of the stretchable display panel 000, the probability of the film layer breakage of the inorganic insulating layer 301 in the inter-island connectors 300 is effectively reduced, and the probability of the film layer separation between the inorganic insulating layer 301 and the first organic insulating layer 302 in the inter-island connectors 300 is reduced.

In summary, the stretchable display panel according to the embodiments of the present disclosure includes: a flexible substrate, pixel islands, and inter-island connectors. The size of the inorganic insulating layer in the inter-island connector is reduced by forming a plurality of first openings in the inorganic insulating layer, such that an area of an orthographic projection of the inorganic insulating layer on the substrate is relatively small. A portion of the first organic insulating layer is filled in the first openings of the inorganic insulating layer, thereby not only improving the stretching deformation capacity of the inter-island connectors, but also enhancing the adhesion between the inorganic insulating layer and the first organic insulating layer. In this way, during the stretching process of the stretchable display panel, the probability of the film layer breakage of the inorganic insulating layer in the inter-island connectors is effectively reduced, and the probability of the film layer separation between the inorganic insulating layer and the first organic insulating layer in the inter-island connectors is reduced, such that the yield of the stretchable display panel is relatively high.

It should be noted that, the plurality of first openings K1 formed in the inorganic insulating layer 301 are circular, oval, square, or in other polygonal shapes or other irregular shapes, which is not limited in the present disclosure.

Figure 6:
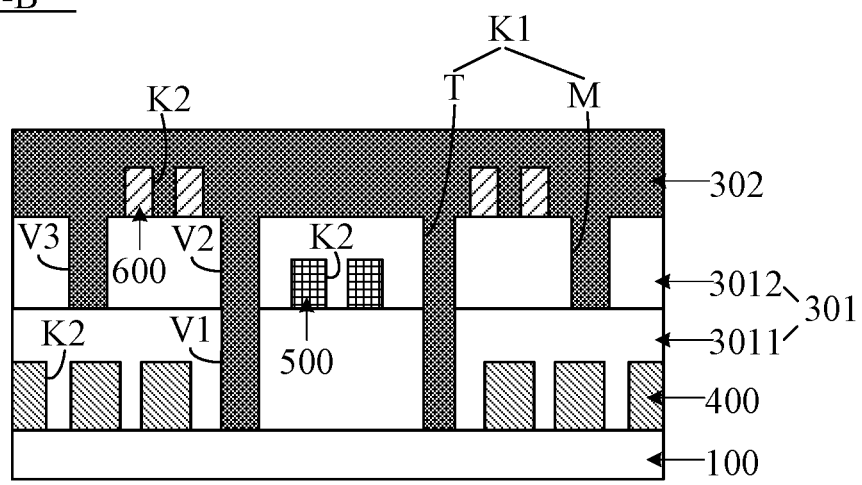
FIG. 6 is a schematic structural diagram of another film layer of the stretchable display panel at B-B' as illustrated in FIG. 2.

In the embodiments of the present disclosure, referring to FIG. 6, FIG. 6 is a schematic diagram of another film layer structure of the stretchable display panel at B-B' as illustrated in FIG. 2. A portion of the first openings K1 in the plurality of first openings K1 in the inorganic insulating layer 301 are through vias T, and another portion of the first openings K1 are blind vias M. The through vias T are holes perforating the inorganic insulating layer 301 entirely, and the blind vias M are holes perforating the inorganic insulating layer 301 partially.

The stretchable display panel 000 further includes: a first conductive layer 400 on a side, distal from the first organic insulating layer 302, of the inorganic insulating layer 301, wherein an orthographic projection of the first conductive layer 400 on the flexible substrate 100 is overlapped with an orthographic projection of the blind via M on the flexible substrate 100 and is not coincident with an orthographic projection of the through via T on the flexible substrate 100. In the present disclosure, since other conductive layer is further arranged at the position of the first conductive layer 400 arranged in the inter-island connector 300, to ensure that no short circuit occurs between the first conductive layer 400 and other conductive layers in the inter-island connector 300, it is necessary to set the first openings K1 at this position to be the blind vias M. That is, the first openings K1 at this position are not entirely perforated, and in this way, the first conductive layer 400 is insulated from other conductive layers by the unperforated portion of the inorganic insulating layer 301.

In the embodiments of the present disclosure, as illustrated in FIG. 6, the inorganic insulating layer 301 in the inter-island connector 300 includes: a first inorganic layer 3011 and a second inorganic layer 3012 that are stacked. The first inorganic layer 3011 is more proximal to the flexible substrate 100 than the second inorganic layer 3012.

Herein, a first via V1 is formed in the first inorganic layer 3011, and a second via V2 and a third via V3 are formed in the second inorganic layer 3012, wherein the first via V1 in the first inorganic layer 3011 is in communication with the second via V2 in the second inorganic layer 3012.

In the present disclosure, the through vias T in the inorganic insulating layer 301 are the first via V1 and the second via V2 in communication with each other, and the blind via M in the inorganic insulating layer 301 is the third via V3. An orthographic projection of the third via V3 in the second inorganic layer 302 on the flexible substrate 100 is not coincident with an orthographic projection of the first via V1 in the first inorganic layer 3011 on the flexible substrate 100.

In this case, since the first via V1 is formed in the first inorganic layer 3011, and the first via V1 is in communication with the second via V2 in the second inorganic layer 3012, an area of an orthographic projection of the first inorganic layer 3011 on the flexible substrate 100 is relatively small, and the portion thereof running through the first organic insulating layer 302 is filled in the first via V1 and the second via V2, such that the degree of interference in the stretching deformation of the inter-island connector 300 from the first inorganic layer 3011 is reduced. Similarly, since the third via V3 is formed in the second inorganic layer 3012, an area of an orthographic projection of the second inorganic layer 3012 on the flexible substrate 100 is relatively small, and the portion thereof running through the first organic insulating layer 302 is filled in the third via V3, such that the degree of interference in the stretching deformation of the inter-island connector 300 from the second inorganic layer 3012 is reduced.

In the embodiments of the present disclosure, as illustrated in FIG. 6, the stretchable display panel 000 further includes: a second conductive layer 500 between the first inorganic layer 3011 and the second inorganic layer 3012, and a third conductive layer 600 between the second inorganic layer 3013 and the first organic insulating layer 302. Herein, the first conductive layer 400, the second conductive layer 500, and the third conductive layer 600 are all conductive layers made of metal materials.

A plurality of second openings K2 are arranged in at least one of the first conductive layer 400, the second conductive layer 500, and the third conductive layer 600. It should be noted that, FIG. 6 takes a case where a plurality of second openings K2 are formed in each of the first conductive layer 400, the second conductive layer 500, and the third conductive layer 600 as an example for illustrative description. It should be further noted that, the second openings K2 formed in the first conductive layer 400, the second conductive layer 500, and the third conductive layer 600 are all through vias.

In the present disclosure, a portion of the first inorganic layer 3011 is filled in the second openings K2 of the first conductive layer 400, such that the first conductive layer 400 has a relatively good adhesion to the first inorganic layer 3011. In this way, in a case that the inter-island connector 300 is under the action of a stretchable force, film layers in the first conductive layer 400 and the first inorganic layer 3011 are not easily separated. A portion of the second inorganic layer 3012 is filled in the second openings K2 of the second conductive layer 500, such that the second conductive layer 500 has a relatively good adhesion to the second inorganic layer 3012. In this way, in a case that the inter-island connector 300 is under the action of a stretchable force, film layers in the second conductive layer 500 and the second inorganic layer 3012 are not easily separated. A portion of the first organic insulating layer 302 is filled in the second openings K2 of the third conductive layer 600, such that the third conductive layer 600 has a relatively good adhesion to the first organic insulating layer 302. In this way, in a case that the inter-island connector 300 is under the action of a stretchable force, film layers in the third conductive layer 600 and the first organic insulating layer 302 are not easily separated.

In this case, in the stretchable display panel 000, through the plurality of second openings K2 in the first conductive layer 400, the second conductive layer 500, and the third conductive layer 600, the conductive layers have an enhanced adhesion to the inorganic layers in contact therewith in the inter-island connector 300, thereby enhancing the stretching deformation capacity of the inter-island connector 300. Thus, the probability of the film layer separation between the conductive layers and the inorganic layers in contact therewith in the inter-island connector 300 is reduced.

It should be noted that shapes of the plurality of second openings K2 in the first conductive layer 400, the second conductive layer 500, and the third conductive layer 600 are circular, oval, square, other polygonal shapes, or other irregular shapes, which is not limited in the present disclosure. Moreover, sizes of the plurality of second openings K2 in the conductive layers are relatively small. For example, in a case that a conductive layer includes signal lines for transmitting signals, the sizes of the second openings K2 in the conductive layer are much less than line widths of the signal lines, such that the signal transmission quality of the conductive layer is not affected by the plurality of second openings K2 formed in the conductive layers.

In the embodiments of the present disclosure, thicknesses of the first conductive layer 400, the second conductive layer 500, and the third conductive layer 600 all range from 0.5 μm to 5 μm. Herein, compared with the thickness of the conductive layer in some practices, the thicknesses of the first conductive layer 400, the second conductive layer 500, and the third conductive layer 600 according to the embodiments of the present disclosure are relatively large. Since the first conductive layer 400, the second conductive layer 500, and the third conductive layer 600 have a large thickness, the first conductive layer 400, the second conductive layer 500, and the third conductive layer 600 have a relatively good stretchable failure resistance. Therefore, in a case that the inter-island connector 300 is under the action of a stretchable force, the probability of the film layer breakage in the first conductive layer 400, the second conductive layer 500, and the third conductive layer 600 is relatively low, and the yield of the stretchable display panel 000 is further improved.

It should be noted that, the first conductive layer 400, the second conductive layer 500, and the third conductive layer 600 are all made of one or more metal materials such as copper, titanium, and aluminum.

In the embodiments of the present disclosure, each of the first conductive layer 400, the second conductive layer 500, and the third conductive layer 600 include: a signal wire for being electrically connected to the light-emitting device 201. Illustratively, the signal wires in the first conductive layer 400, the second conductive layer 500, and the third conductive layer 600 are electrically connected to the light-emitting device 201 by the pixel driver circuit 202. In this way, the pixel driver circuits 202 in different pixel islands 200 are connected in series by the signal wires distributed in the inter-island connector 300, such that each light-emitting device 201 in different pixel islands 200 is controlled by a same driver chip.

Figure 7:
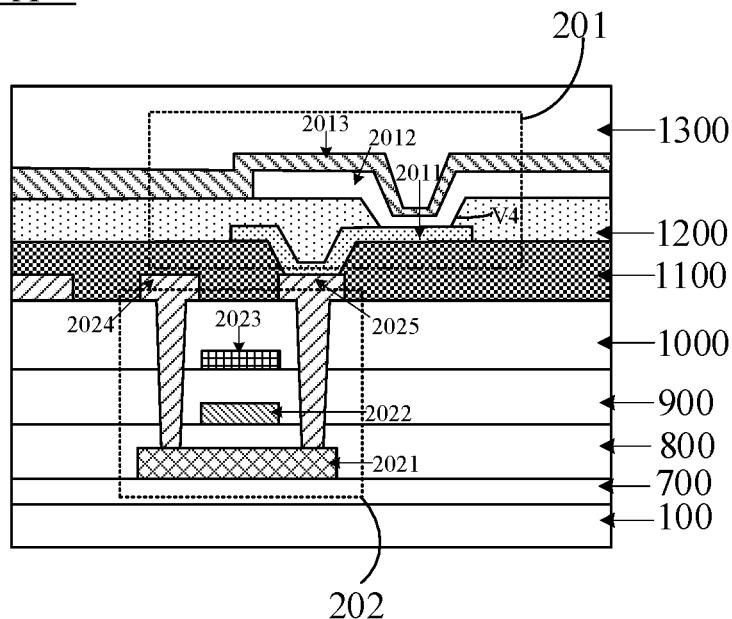
FIG. 7 is a schematic structural diagram of another film layer of the stretchable display panel at A-A' as illustrated in FIG. 2.

In the present disclosure, as illustrated in FIG. 7, FIG. 7 is a schematic structural diagram of another film layer of the stretchable display panel at A-A' as illustrated in FIG. 2. The pixel driver circuit 202 in the pixel island 200 is positioned on a side, proximal to the light-emitting device 201, of the flexible substrate 100. The pixel driver circuit 202 includes: an active layer 2021, a first gate electrode 2022, a second gate electrode 2023, a source electrode 2024, and a drain electrode 2025, wherein the source electrode 2024 and the drain electrode 2025 are both lapped to the active layer 2021, and one of the source electrode 2024 and the drain electrode 2025 is electrically connected to the light-emitting device 201, while the other of the source electrode 2024 and the drain electrode 2025 needs to be electrically connected to the signal wires. Herein, the first gate electrode 2022, the second gate electrode 2023, the source electrode 2024, and the drain electrode 2025 are all conductive layers made of a metal.

The active layer 2021 is insulated from the flexible substrate 100 by a first insulating layer 700, the active layer 2021 is insulated from the first gate electrode 2022 by a first gate insulating layer 800, and the first gate electrode 2022 is insulated from the second gate electrode 2023 by a second gate insulating layer 900. The conductive pattern in which the source electrode 2024 and the drain 2025 are disposed is insulated from the second gate electrode 2023 by a second insulating layer 1000. Herein, the first insulating layer 700, the first gate insulating layer 800, the second gate insulating layer 900, and the second insulating layer 1000 are all inorganic layers.

The light-emitting device 201 includes: an anode layer 2011, a light-emitting layer 2012, and a cathode layer 2013 that are stacked. The pixel driver circuit 202 is electrically connected to the anode layer 2011 in the light-emitting device 201. Illustratively, the drain electrode 2025 is electrically connected to the anode layer 2011 of the light-emitting device 201, and a first planarization layer 1100 is arranged between the drain electrode 2025 and the anode layer 2011.

The stretchable display panel 000 further includes: a pixel definition layer 1200, wherein a plurality of pixel holes V4 are formed in the pixel definition layer 1200, and in each pixel hole V4, a portion of the anode layer 2011 in the pixel hole V4, a portion of the light-emitting layer 2012 in the pixel hole V4, and a portion of the cathode layer 2013 in the pixel hole V4 constitute one light-emitting device 201.

In the embodiments of the present disclosure, the first inorganic layer 3011 in the inter-island connector 300 is arranged in the same layer as the second gate insulating layer 900 in the pixel island 200; and the second inorganic layer 3012 in the inter-island connector 300 is arranged in the same layer as the second insulating layer 1000 in the pixel island 200; and the first organic insulating layer 302 in the inter-island connector 300 is arranged in the same layer as at least one of the first planarization layer 1100 and the pixel definition layer 1200 in the pixel island 200. The first conductive layer 400 in the inter-island connector 300 is arranged in the same layer and of the same material as the first gate electrode 2022 in the pixel island 200; the second conductive layer 500 in the inter-island connector 300 is arranged in the same layer and of the same material as the second gate electrode 2023 in the pixel island 200; and the third conductive layer 600 in the inter-island connector 300 is arranged in the same layer and of the same material as the source electrode 2024 and the drain electrode 2025 in the pixel island 200.

In some practices, as illustrated in FIG. 1, the stretchable display panel 000 further includes: a packaging layer 05 for packaging and protecting the inter-island connector 03 and the pixel island 02. An inorganic packaging layer in the packaging layer 05 is arranged to be in contact with the organic insulating layer 033, and the inorganic packaging layer in the packaging layer 05 has a relatively poor adhesion to the organic insulating layer 033. Therefore, in a case that the stretchable display panel 000 is stretched, the inter-island connector 03, under the action of a stretchable force, causes the film layers in the inorganic packaging layer in the packaging layer 05 and the organic insulating layer 033 to be easily broken or separated.

Figure 8:
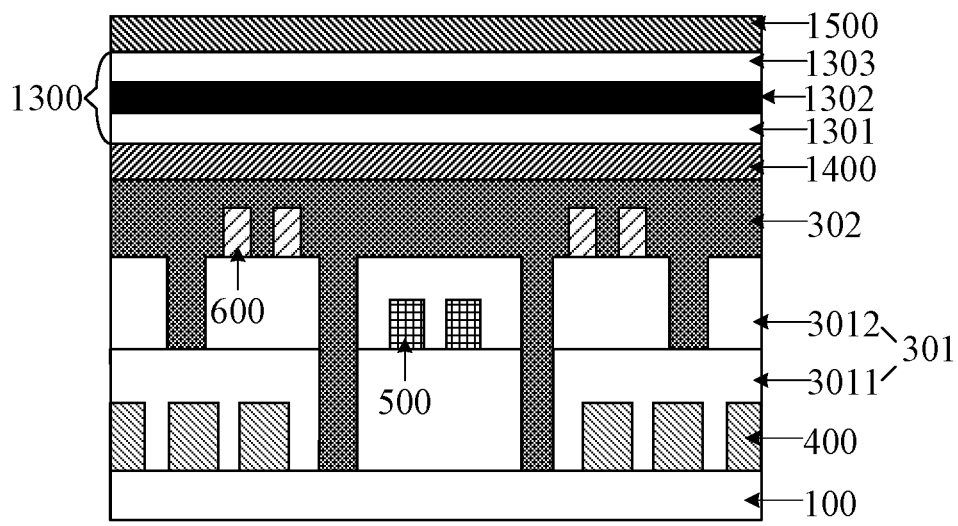
FIG. 8 is a schematic structural diagram of still another film layer of the stretchable display panel at B-B' as illustrated in FIG. 2.

In the embodiments of the present disclosure, referring to FIG. 8, FIG. 8 is a schematic structural diagram of still another film layer of the stretchable display panel at B-B' as illustrated in FIG. 2. The stretchable display panel 000 further includes: a packaging layer 1300 for covering the pixel island 200 and the inter-island connector 300, and a first elastic layer 1400 between the packaging layer 1300 and the first organic insulating layer 302, wherein an elasticity modulus of the first elastic layer 1400 is less than an elasticity modulus of the first organic insulating layer 302 and an elasticity modulus of the inorganic layer in the packaging layer 1300. Herein, the packaging layer 1300 protects the pixel island 200 and the inter-island connector 300 from corrosion by moisture, oxygen, and the like in the air, which causes the stretchable display panel 000 failure.

The greater the elasticity modulus of the first elastic layer 1400, the smaller the stretching deformation capacity of the first elastic layer 1400, that is, the greater the rigidity of the first elastic layer 1400. The packaging layer 1300 includes: a first inorganic packaging layer 1301, an organic packaging layer 1302, and a second inorganic packaging layer 1303 that are stacked, wherein the first inorganic packaging layer 1301 and the second inorganic packaging layer 1303 are both inorganic layers made of inorganic materials, and the elasticity modulus thereof is greater than the elasticity modulus of the first elastic layer 1400.

In the present disclosure, the first elastic layer 1400 is disposed between the first organic insulating layer 302 and the first inorganic packaging layer 1301 in the packaging layer 1300. The elasticity modulus of the first elastic layer 1400 is less than the elasticity modulus of the first organic insulating layer 302 and the elasticity modulus of the first inorganic packaging layer 1301 in the packaging layer 1300. Therefore, in a case that the stretchable display panel 000 is under the action of a stretchable force, the first elastic layer 1400 is capable of relieving the stress generated by the first inorganic packaging layer 1301 during the stretching deformation process, such that the film layers of the first inorganic packaging layer 1301 and the first organic insulating layer 302 are not easily separated, thereby improving the stretching deformation capability of the inter-island connector 300. Thus, the probability of the film layer separation in the inter-island connector 300 of the stretchable display panel 000 is reduced.

In the embodiments of the present disclosure, as illustrated in FIG. 8, the stretchable display panel 000 further includes: a second elastic layer 1500 on a side, distal from the flexible substrate 100, of the packaging layer 1300, wherein an elasticity modulus of the second elastic layer 1500 is equal to the elasticity modulus of the first elastic layer 1400 and less than the elasticity modulus of the inorganic layer in the packaging layer 1300. The smaller the elasticity modulus of the second elastic layer 1500, the greater the stretching deformation capacity of the second elastic layer 1500, that is, the film layer in the second elastic layer 1500 is not easily broken or separated.

In the present disclosure, the elasticity modulus of the second elastic layer 1500 is less than the elasticity modulus of the inorganic layer in the packaging layer 1300. Therefore, in a case that the stretchable display panel 000 is under the action of a stretchable force, the second elastic layer 1500 relieves the stress generated between the second inorganic packaging layer 1303 and the organic packaging layer 1302 during the stretching deformation process, such that the film layer of the second inorganic packaging layer 1303 and the organic insulating layer 1302 in the packaging layer 1300 are not easily separated, thereby improving the stretching deformation capability of the packaging layer 1300.

In the embodiments of the present disclosure, thicknesses of the first elastic layer 1400 and the second elastic layer 1500 shall not be too large or too small. In a case that the thicknesses of the first elastic layer 1400 and the second elastic layer 1500 are too large or the thicknesses of the first elastic layer 1400 and the second elastic layer 1500 are too small, the first elastic layer 1400 and the second elastic layer 1500 do not relieve the stress. Thus, the thicknesses of the first elastic layer 1400 and the second elastic layer 1500 range from 1 μm to 10 μm. It should be noted that, the first elastic layer 1400 and the second elastic layer 1500 are made of the same material. Illustratively, the first elastic layer 1400 and the second elastic layer 1500 are made of an organic material with a low elasticity modulus such as polydimethylsiloxane and polyurethane.

It should be noted that, in other possible implementations, in a case that the temperature for manufacturing the stretchable display panel 000 is relatively low (for example, the process temperature is below 200° C.), an elastic layer is arranged on a side, proximal to the flexible substrate 100, of the first inorganic layer 3011 and the second inorganic layer 3012, and/or an elastic layer is arranged on a side, distal from the flexible substrate 100, of the second inorganic layer 3012. Illustratively, an elastic layer is arranged between the first inorganic layer 3011 and the second inorganic layer 3012, wherein the elasticity modulus of the elastic layer is less than the elasticity modulus of the first inorganic layer 3011 and the second inorganic layer 3012. In this way, in a case that the stretchable display panel 000 is under the action of a stretchable force, the elastic layer relieves the stress generated by the first inorganic layer 3011 and the second inorganic layer 3012 during the stretching deformation, such that the film layer of the first inorganic layer 3011 and the second inorganic layer 3012 within the stretchable display panel 000 are not easily separated, thereby improving the stretching deformation capability of the stretchable display panel 000.

In some practices, as illustrated in FIG. 1, the conductive layer, the inorganic insulating layer, and the organic insulating layer are not present in the hollowed-out structure 000a of the stretchable display panel 000. Thus, the stretchable display panel 000 applies electrical signals to the pixel driver circuit 202 electrically connected to the light-emitting device 201 only via the signal wires in the inter-island connector 03 to cause the light-emitting device 201 to emit light to enable the stretchable display panel 000 to display an image. However, due to the generally large number of signal wires within the stretchable display panel 000, arranging the signal wires only in the inter-island connectors 03 causes a complicated arrangement of the signal wires arranged in the inter-island connectors 03.

Figure 9:
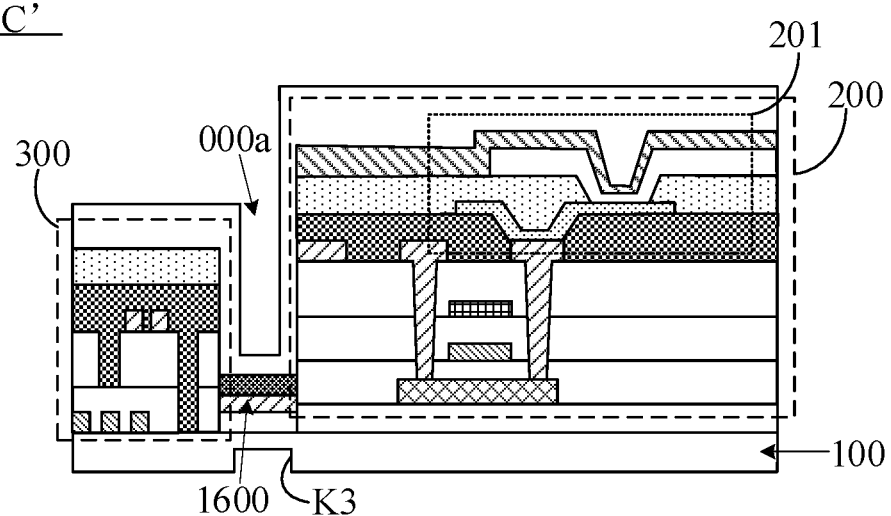
FIG. 9 is a schematic structural diagram of a film layer of the stretchable display panel at C-C' as illustrated in FIG. 2.

In the present disclosure, referring to FIG. 9, FIG. 9 is a schematic diagram of the film layer structure of the stretchable display panel at C-C' as illustrated in FIG. 2. The pixel islands 200 and the inter-island connectors 300 define a hollowed-out structure 000a, and the stretchable display panel 000 further includes an auxiliary signal line 1600, wherein an orthographic projection of the auxiliary signal line 1600 on the flexible substrate 100 is at least partially overlapped with an orthographic projection of the hollowed-out structure 000a on the flexible substrate 100, and the auxiliary signal line 1600 is electrically connected to the light-emitting device 201. Herein, one end of the auxiliary signal line 1600 is electrically connected to the light-emitting device 201 via the pixel driver circuit 202, and the other end of the auxiliary signal line 1600 is electrically connected to the signal wires in the inter-island connector 300. In this way, the stretchable display panel 000 also applies electrical signals to the light-emitting device 201 via the auxiliary signal line 1600 electrically connected to the light-emitting device 201 in the hollowed-out structure 000a.

In this case, since the auxiliary signal line 1600 is also arranged in the hollowed-out structure 000a of the stretchable display panel 000, it is possible to simplify the arrangement of the signal wires arranged in the inter-island connectors 300 on the premise of ensuring the normal wire arrangement of the stretchable display panel 000.

In the present disclosure, the auxiliary signal line 1600 is arranged in the same layer as any one of the first conductive layer 400, the second conductive layer 500, and the third conductive layer 600 in the inter-island connector 300. Moreover, a shape of the wires of the auxiliary signal line 1600 is a serpentine. In this way, the serpentine auxiliary signal line 1600 in the hollowed-out structure 000a is elongated after the stretchable display panel 000 is bent and deformed, such that the hollowed-out structure 000a of the stretchable display panel 000 is deformed, which in turn ensures that the stretchable display panel 000 is bent into a spherical shape.

Figure 10:
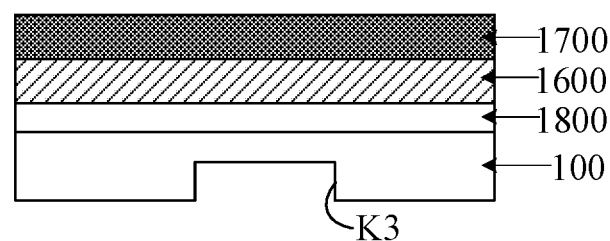
FIG. 10 is a schematic structural diagram of a partially enlarged film layer at a hollowed-out structure as illustrated in FIG. 9.

In the embodiments of the present disclosure, referring to FIG. 10, FIG. 10 is a schematic diagram of the partially enlarged film layer structure at a hollowed-out structure as illustrated in FIG. 9. The stretchable display panel 000 further includes: a second organic insulating layer 1700 in the hollowed-out structure 000a, wherein the second organic insulating layer 1700 is disposed on a side, distal from the flexible substrate 100, of the auxiliary signal line 1600. Herein, the second organic insulating layer 1700 is capable of protecting the auxiliary signal line 1600, such that the auxiliary signal line 1600 in the hollowed-out structure 000a is not subjected to cross short circuit after the stretchable display panel 000 is bent and deformed.

In the present disclosure, the second organic insulating layer 1700 is arranged in the same layer as at least one of the first planarization layer 1100 and the pixel definition layer 1200 according to the above embodiments. The second organic insulating layer 1700 in the hollowed-out structure 000a does not affect the bending and deformation of the stretchable display panel 000, because the second organic insulating layer 1700 has a relatively good capability against deformation by force.

In the embodiments of the present disclosure, the stretchable display panel 000 further includes: a third organic insulating layer 1800 in the hollowed-out structure 000a, wherein the third organic insulating layer 1800 is disposed on a side, proximal to the flexible substrate 100, of the auxiliary signal line 1600. Herein, the third organic insulating layer 1800 is capable of protecting the auxiliary signal line 1600, such that the auxiliary signal line 1600 in the hollowed-out structure 000a is not subjected to cross short circuit after the stretchable display panel 000 is bent and deformed.

In the present disclosure, a third opening K3 is formed in a side, distal from the pixel island 200, of the flexible substrate 100, and a region where the third opening K3 is disposed is within the orthographic projection of the hollowed-out structure 000*a* on the flexible substrate 100. Illustratively, a shape of the third opening K3 is the same as a shape of the hollowed-out structure 000*a*. Herein, since the third opening K3 corresponding to the hollowed-out structure 000*a* is formed in the flexible substrate 100, it becomes easier to bend at the hollowed-out structure 000*a*, which in turn makes it easier for the stretchable display panel 000 to bend and deform.

It should be noted that, after the pixel islands 200, inter-island connectors 300, and packaging layer 1300 are configured on the flexible substrate 100, a one-time patterning process is performed on a side, distal from the pixel islands 200, of the flexible substrate 100 to form the third opening K3 on the flexible substrate 100. A thickness of the flexible substrate 100 is reduced during such process, making it easier for the stretchable display panel 000 to bend and deform.

In summary, the stretchable display panel according to the embodiments of the present disclosure includes: a flexible substrate, pixel islands, and inter-island connectors. The size of the inorganic insulating layer in the inter-island connector is reduced by forming a plurality of first openings in the inorganic insulating layer, such that an area of an orthographic projection of the inorganic insulating layer on the substrate is relatively small. A portion of the first organic insulating layer is filled in the first openings of the inorganic insulating layer, thereby not only improving the stretching deformation capacity of the inter-island connectors, but also enhancing the adhesion between the inorganic insulating layer and the first organic insulating layer. In this way, during the stretching process of the stretchable display panel, the probability of the film layer breakage of the inorganic insulating layer in the inter-island connectors is effectively reduced, and the probability of the film layer separation between the inorganic insulating layer and the first organic insulating layer in the inter-island connectors is reduced, such that the yield of the stretchable display panel is relatively high.

In the embodiments of the present disclosure, as illustrated in FIGS. 9 and 10, the stretchable display panel 000 includes: the flexible substrate 100, the plurality of pixel islands 200 on the flexible substrate 100, the inter-island connectors 300 for connecting the adjacent pixel islands 200, and the auxiliary signal line 1600;

wherein the pixel island 200 is provided with at least one light-emitting device 201; and the pixel islands 200 and the inter-island connectors 300 define the hollowed-out structure 000*a*; and the orthographic projection of the auxiliary signal line 1600 on the flexible substrate 100 is at least partially overlapped with the orthographic projection of the hollowed-out structure 000*a* on the flexible substrate 100, and the auxiliary signal line 1600 is electrically connected to the light-emitting device 201.

Optionally, the stretchable display panel 000 further includes: the second organic insulating layer 1700 in the hollowed-out structure 000*a*, the second organic insulating layer 1700 being disposed on a side, distal from the flexible substrate 100, of the auxiliary signal line 1600.

Optionally, the stretchable display panel 000 further includes: the third organic insulating layer 1800 in the hollowed-out structure 000*a*, wherein the third organic insulating layer 1800 is disposed on a side, proximal to the flexible substrate 100, of the auxiliary signal line 1600.

Optionally, the third opening K3 is formed in a side, distal from the pixel island 200, of the flexible substrate 100, and the region where the third opening K3 is formed is within the orthographic projection of the hollowed-out structure 000*a* on the flexible substrate 100.

In the embodiments of the present disclosure, the specific structure and beneficial effects refer to the relevant content according to the above embodiments, and details shall not be repeated herein.

The embodiments of the present disclosure further provide a method for manufacturing a stretchable display panel, and the method for manufacturing the stretchable display panel is used to manufacture the stretchable display panel illustrated in the above embodiments. The method for manufacturing the stretchable display panel includes:

forming, on a flexible substrate, a plurality of pixel islands and inter-island connectors for connecting the adjacent pixel islands, wherein the pixel island is provided with at least one light-emitting device; and the inter-island connector includes: an inorganic insulating layer and a first organic insulating layer, wherein the inorganic insulating layer is more proximal to the flexible substrate than the first organic insulating layer, and a plurality of first openings are formed in the inorganic insulating layer, a portion of the first organic insulating layer being in the first openings.

Optionally, the manufacturing method further includes: before forming, on the flexible substrate, the plurality of pixel islands and the inter-island connectors for connecting the adjacent pixel islands, providing a rigid substrate, and forming, on the rigid substrate, the flexible substrate, the plurality of pixel islands and the inter-island connectors, and then, peeling off the rigid substrate to obtain a stretchable display panel.

Optionally, a third opening is formed in a side, distal from the pixel islands, of the flexible substrate after peeling off the rigid substrate.

It can be clearly understood by those skilled in the art that, for the convenience and brevity of the description, the specific principles of the stretchable display panel described above refer to the corresponding content according to the aforementioned embodiments of the stretchable display panel structure, and details shall not be repeated herein.

In summary, the method for manufacturing the stretchable display panel according to the embodiments of the present disclosure includes: forming pixel islands and inter-island connectors on the flexible substrate. The size of the inorganic insulating layer in the inter-island connector is reduced by forming a plurality of first openings in the inorganic insulating layer, such that an area of an orthographic projection of the inorganic insulating layer on the substrate is relatively small. A portion of the first organic insulating layer is filled in the first openings of the inorganic insulating layer, thereby not only improving the stretching deformation capacity of the inter-island connectors, but also enhancing the adhesion between the inorganic insulating layer and the first organic insulating layer. In this way, during the stretching process of the stretchable display panel, the probability of the film layer breakage of the inorganic insulating layer in the inter-island connectors is effectively reduced, and the probability of the film layer separation between the inorganic insulating layer and the first organic insulating layer in the inter-island connectors is reduced, such that the yield of the stretchable display panel is relatively high.

The embodiments of the present disclosure further provide a display device. The display device may be: any product or component with a display function, such as a mobile phone, a tablet computer, a television, a display, a notebook computer, a digital photo frame, and a navigator. The display device includes: a power supply assembly and a stretchable display panel, wherein the stretchable display panel is the stretchable display panel according to the above embodiments.

In the embodiments of the present disclosure, the stretchable display panel is an OLED display panel or an active matrix-organic light emitting diode (AM-OLED) stretchable display panel.

It should be noted that, in the accompanying drawings, the sizes of the layers and regions may be exaggerated for clarity of illustration. Also, it can be understood that, where an element or layer is referred to as being "on" another element or layer, it may be directly on the other element, or an intermediate layer may be present. In addition, it can be understood that, where an element or layer is referred to as being "under" another element or layer, it may be directly under the other element, or one or more intermediate layers or elements may be present. In addition, it can also be understood that, where a layer or element is referred to as being "between" two layers or elements, it may be the only layer between the two layers or elements, or one or more intermediate layers or elements may also be present. Like reference numerals refer to like elements throughout the present disclosure.

In the present disclosure, the terms "first" and "second" are merely used for descriptive purposes and should not be construed as indicating or implying the relative importance. The term "a plurality of" refers to two or more, unless otherwise explicitly defined.

Described above are merely optional embodiments of the present disclosure and are not intended to limit the present disclosure. Any modifications, equivalents, improvements, and the like, made within the spirit and principle of the present disclosure should fall within the protection scope of the present disclosure.

The invention claimed is:

1. A stretchable display panel, comprising:
a flexible substrate;
a plurality of pixel islands on the flexible substrate, the pixel islands being provided with at least one light-emitting device; and
inter-island connectors for connecting the adjacent pixel islands, wherein the inter-island connector comprises: an inorganic insulating layer and a first organic insulating layer, wherein the inorganic insulating layer is more proximal to the flexible substrate than the first organic insulating layer, and a plurality of first openings are formed in the inorganic insulating layer, a portion of the first organic insulating layer being in the first openings;
wherein one portion of the first openings of the plurality of first openings are through vias, and the other portion of the first openings are blind vias;
the stretchable display panel further comprises: a first conductive layer on a side, distal from the first organic insulating layer, of the inorganic insulating layer, wherein an orthographic projection of the first conductive layer on the flexible substrate is overlapped with an orthographic projection of the blind via on the flexible substrate and is not coincident with an orthographic projection of the through via on the flexible substrate.

2. The stretchable display panel according to claim 1, wherein the inorganic insulating layer comprises: a first inorganic layer and a second inorganic layer that are stacked, wherein the first inorganic layer is more proximal to the flexible substrate than the second inorganic layer, a first via is formed in the first inorganic layer, and a second via and a third via are formed in the second inorganic layer, the first via being in communication with the second via;
wherein the through vias are the first via and the second via in communication with each other, and the blind via is the third via.

3. The stretchable display panel according to claim 2, further comprising: a second conductive layer between the first inorganic layer and the second inorganic layer, and a third conductive layer between the second inorganic layer and the first organic insulating layer;
wherein a plurality of second openings are formed in at least one of the first conductive layer, the second conductive layer, and the third conductive layer.

4. The stretchable display panel according to claim 3, wherein thicknesses of the first conductive layer, the second conductive layer, and the third conductive layer range from 0.5 μm to 5 μm.

5. The stretchable display panel according to claim 3, wherein each of the first conductive layer, the second conductive layer, and the third conductive layer comprises: a signal wire for being electrically connected to the light-emitting device.

6. The stretchable display panel according to claim 1, further comprising: a packaging layer for covering the pixel islands and the inter-island connectors, and a first elastic layer between the packaging layer and the first organic insulating layer, wherein an elasticity modulus of the first elastic layer is less than an elasticity modulus of the first organic insulating layer.

7. The stretchable display panel according to claim 6, further comprising: a second elastic layer on a side, distal from the flexible substrate, of the packaging layer, wherein an elasticity modulus of the second elastic layer is equal to the elasticity modulus of the first elastic layer.

8. The stretchable display panel according to claim 1, wherein the pixel islands and the inter-island connectors define a hollowed-out structure, and the stretchable display panel further comprises: an auxiliary signal line, wherein an orthographic projection of the auxiliary signal line on the flexible substrate is at least partially overlapped with an orthographic projection of the hollowed-out structure on the flexible substrate, and the auxiliary signal line is electrically connected to the light-emitting device.

9. The stretchable display panel according to claim 8, further comprising: a second organic insulating layer in the hollowed-out structure, wherein the second organic insulating layer is disposed on a side, distal from the flexible substrate, of the auxiliary signal line.

10. The stretchable display panel according to claim 9, further comprising: a third organic insulating layer in the hollowed-out structure, wherein the third organic insulating layer is disposed on a side, proximal to the flexible substrate, of the auxiliary signal line.

11. The stretchable display panel according to claim 8, wherein a third opening is formed in a side, distal from the pixel island, of the flexible substrate, and a region where the third opening is formed is within the orthographic projection of the hollowed-out structure on the flexible substrate.

12. A stretchable display panel, comprising:
a flexible substrate;

a plurality of pixel islands on the flexible substrate, the pixel islands being provided with at least one light-emitting device;

inter-island connectors for connecting the adjacent pixel islands, wherein the pixel islands and the inter-island connectors define a hollowed-out structure;

and an auxiliary signal line, wherein an orthographic projection of the auxiliary signal line on the flexible substrate is at least partially coincident with an orthographic projection of the hollowed-out structure on the flexible substrate, and the auxiliary signal line is electrically connected to the light-emitting device;

wherein the inter-island connector comprises: an inorganic insulating layer and a first organic insulating layer, wherein the inorganic insulating layer is more proximal to the flexible substrate than the first organic insulating layer, and a plurality of first openings are formed in the inorganic insulating layer, a portion of the first organic insulating layer being in the first openings;

wherein one portion of the first openings of the plurality of first openings are through vias, and the other portion of the first openings are blind vias;

the stretchable display panel further comprises: a first conductive layer on a side, distal from the first organic insulating layer, of the inorganic insulating layer, wherein an orthographic projection of the first conductive layer on the flexible substrate is overlapped with an orthographic projection of the blind via on the flexible substrate and is not coincident with an orthographic projection of the through via on the flexible substrate.

13. A display device, comprising: a power supply assembly, and a stretchable display panel electrically connected to the power supply assembly;

wherein the stretchable display panel comprises:

a flexible substrate;

a plurality of pixel islands on the flexible substrate, the pixel islands being provided with at least one light-emitting device; and inter-island connectors for connecting the adjacent pixel islands, wherein the inter-island connector comprises: an inorganic insulating layer and a first organic insulating layer, wherein the inorganic insulating layer is more proximal to the flexible substrate than the first organic insulating layer, and a plurality of first openings are formed in the inorganic insulating layer, a portion of the first organic insulating layer being in the first openings;

wherein one portion of the first openings of the plurality of first openings are through vias, and the other portion of the first openings are blind vias;

the stretchable display panel further comprises: a first conductive layer on a side, distal from the first organic insulating layer, of the inorganic insulating layer, wherein an orthographic projection of the first conductive layer on the flexible substrate is overlapped with an orthographic projection of the blind via on the flexible substrate and is not coincident with an orthographic projection of the through via on the flexible substrate.

14. The display device according to claim 13, wherein the inorganic insulating layer comprises: a first inorganic layer and a second inorganic layer that are stacked, wherein the first inorganic layer is more proximal to the flexible substrate than the second inorganic layer, a first via is formed in the first inorganic layer, and a second via and a third via are formed in the second inorganic layer, the first via being in communication with the second via;

wherein the through vias are the first via and the second via in communication with each other, and the blind via is the third via.

15. The display device according to claim 14, wherein the stretchable display panel further comprises: a second conductive layer between the first inorganic layer and the second inorganic layer, and a third conductive layer between the second inorganic layer and the first organic insulating layer;

wherein a plurality of second openings are formed in at least one of the first conductive layer, the second conductive layer, and the third conductive layer.

16. The display device according to claim 15, wherein thicknesses of the first conductive layer, the second conductive layer, and the third conductive layer range from 0.5 μm to 5 μm.

17. The display device according to claim 15, wherein each of the first conductive layer, the second conductive layer, and the third conductive layer comprises: a signal wire for being electrically connected to the light-emitting device.

* * * * *